(12) United States Patent
Fatemi et al.

(10) Patent No.: US 6,265,089 B1
(45) Date of Patent: Jul. 24, 2001

(54) ELECTRONIC DEVICES GROWN ON OFF-AXIS SAPPHIRE SUBSTRATE

(75) Inventors: Mohammad Fatemi, McLean, VA (US); Alma E. Wickenden, Woodbine, MD (US); Daniel D. Koleske, Fairfax, VA (US); Richard Henry, Great Falls, VA (US); Mark Twigg, Falls Church, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/353,871

(22) Filed: Jul. 15, 1999

(51) Int. Cl.$^7$ ........................................................ B32B 9/00
(52) U.S. Cl. ........................... 428/698; 428/689; 428/697; 428/700; 257/103; 257/201; 257/627; 257/628; 438/478

(58) Field of Search ...................................... 428/689, 697, 428/700, 698; 257/103, 627, 628, 76, 201; 438/478; 148/33, 33.4

(56) References Cited

U.S. PATENT DOCUMENTS

| | | | |
|---|---|---|---|
| 4,908,074 | * | 3/1990 | Hosoi et al. ........................ 148/33.2 |
| 5,587,593 | * | 12/1996 | Koide et al. ............................ 257/94 |

* cited by examiner

*Primary Examiner*—Deborah Jones
*Assistant Examiner*—Abraham Bahta
(74) *Attorney, Agent, or Firm*—John J. Karasek; George A. Kapp

(57) ABSTRACT

An electronic device characterized by a 10–300 micron thick sapphire crystal substrate having a polished off a-plane growth surface, a 10–1000 angstrom thick nucleating layer disposed on the substrate for promoting film growth thereon, and a 0.1–10 micron thick semiconducting film disposed on the nucleating layer.

18 Claims, 4 Drawing Sheets

1 μm        g

ELECTRONIC DEVICES GROWN ON OFF-AXIS SAPPHIRE SUBSTRATE

BACKGROUND OF THE INVENTION

1. Field of the Invention

This invention pertains to an electronic device characterized by a semiconductor film disposed on a growth surface of a sapphire substrate wherein the growth surface is off a-axis.

2. Description of the Related Art

The growth of high quality semiconducting films of III/V elements of the Periodic Table on a sapphire substrate has been a topic of major interest in recent years. Attempts have been made to improve the material quality of the films by optimizing essential growth parameters such as temperature, buffer layer, and the chemical composition of the film constituents. However, the role of the vicinal angle, while recognized in some materials such as gallium arsenide on silicon, has remained unexplored in the case of the semiconducting films on sapphire substrates. It is known that growth of a film on basal plane (0001) or the c-plane of sapphire substrates through off c-plane angles of up to 10° have shown to be of little help in improving the overall quality of the film.

OBJECTS AND BRIEF SUMMARY OF THE INVENTION

An object of this invention is an electronic device wherein a semiconducting film is disposed vicinally on a-plane of a sapphire substrate which device has improved electrical and crystalline properties.

Another object of this invention is to enhance the reliability of an electronic device grown on a sapphire substrate.

Another object of this invention is an electronic device, on a sapphire substrate, that has improved electrical properties and more uniform properties when measured from center to edge of the electronic device.

These and other objects of this invention are achieved by an electronic device wherein a semiconducting film is arranged on a vicinally disposed a-plane substrate.

DETAILED DESCRIPTION OF THE INVENTION

This invention pertains to an electronic device characterized by a semiconducting film adhering to an off a-plane top surface of a sapphire substrate that has unexpectedly improved electrical and crystalline properties.

Figure 1:
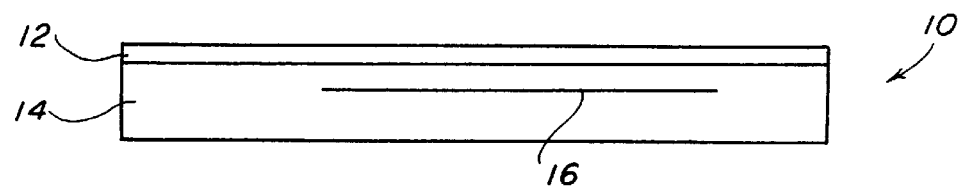
FIG. 1 is a schematic sketch of an electronic device component composed of a sapphire crystal substrate having disposed thereon a semiconducting film.

Electronic device 10 shown in FIG. 1 has semiconducting film 12 disposed over sapphire substrate 14 wherein the top surface of the substrate is off a-plane by a desired vicinal angle. Thickness of film 12 is typically less than 100 microns but typically is greater than 0.1 micron, such as about 2 microns, and thickness of substrate 14 is typically less than 300 microns but typically is greater than 10 microns, such as about 100 microns. The substrate and the film thereon are typically about 2 inches in diameter. Dimensions of the device are not critical. Line 16 in FIG. 1 denotes disposition of a-planes in the sapphire substrate.

Figure 2:
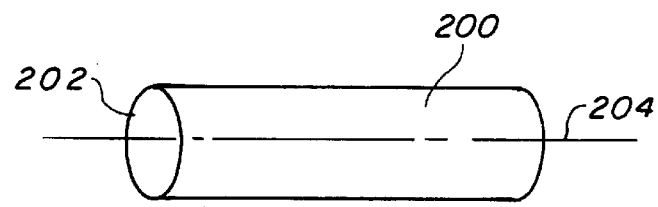
FIG. 2 shows a horizontally disposed sapphire boule and a vertically disposed a-plane forming an outside surface of the boule.

A horizontally disposed sapphire crystal boule 200 is shown in FIG. 2 with a-plane growth surface 202 and horizontal axis 204. Any cut made off a-plane is the focus herein. Growth of film on a plane that is off the a-plane produces unexpectedly improved electrical and crystalline properties. A crystallographer can ascertain by known means that surface 202 is a-plane. This is done by projecting x-rays at surface 202 and recording on a photographic film the reflected x-rays. The a-plane disposition is established if reflected x-rays form a pattern on the photographic film with a center disposed at a point corresponding to the a-plane center.

Figure 3:
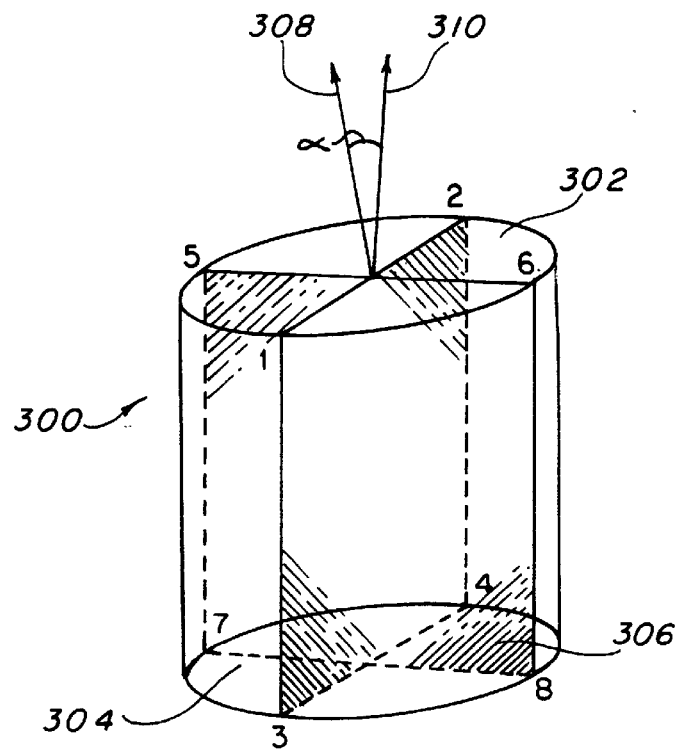
FIG. 3 is a depiction of a sapphire crystal boule showing relative disposition of a-plane, c-plane, and m-plane.

A sapphire crystal boule 300 is shown in FIG. 3. The top surface 302 is a'-plane which is off a-plane by a vicinal angle. The c-plane 304 is defined by quadrangle 1-2-3-4 and the m-plane 306 is defined by quadrangle 5-6-7-8. The arrow 308 is the a'-axis and is, of course, perpendicular to a'-plane 302. The arrow 310 is the surface normal and designates a-axis that is perpendicular to the a-plane. Angle α is the vicinal angle and indicates how much a'-plane is off a-plane.

It should be understood that off a-plane means in a forward or backward directions, to one or the opposite side of the surface normal since the same growth surface is obtained. Off a-axis means that a'-plane can be tilted towards c-plane 304 and/or towards m-plane 306 in addition to being off a-plane.

Figure 4:
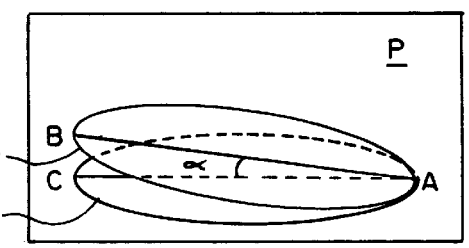
FIG. 4 is a schematic illustrating definition of what is a vicinal angle.

Vicinal angle α is the angle that a'-plane makes with the a-plane. The vicinal angle is defined in conjunction with FIG. 4 which shows a'-plane disposed at an angle α from a-plane. The vicinal angle is the angle between lines AB and AC, which lines are formed by the intersection of a third plane "p" that is perpendicular to both a-plane and a'-plane. Point A in FIG. 4 is the intersection point of a-plane, a'-plane, line AB, line AC, and p-plane.

Figure 5:
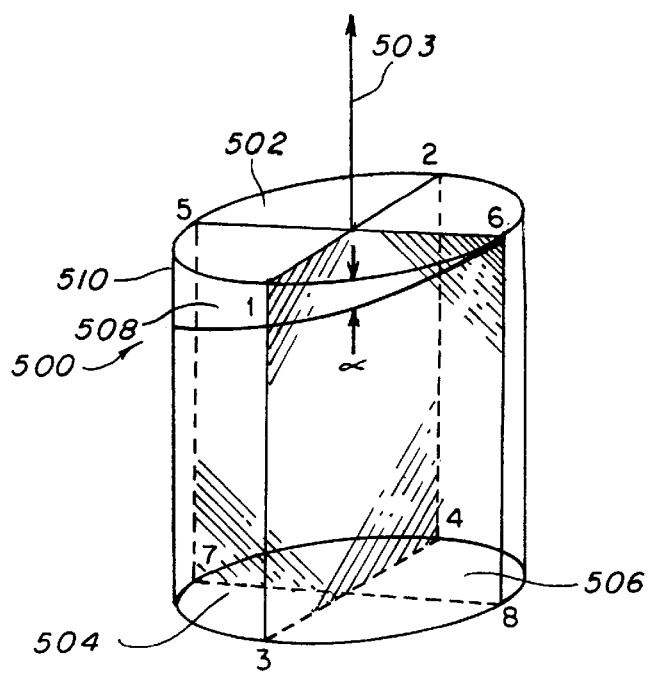
FIG. 5 is an illustration of the vicinal angle in the context of removing a sliver from a sapphire crystal boule.
Figure 6:
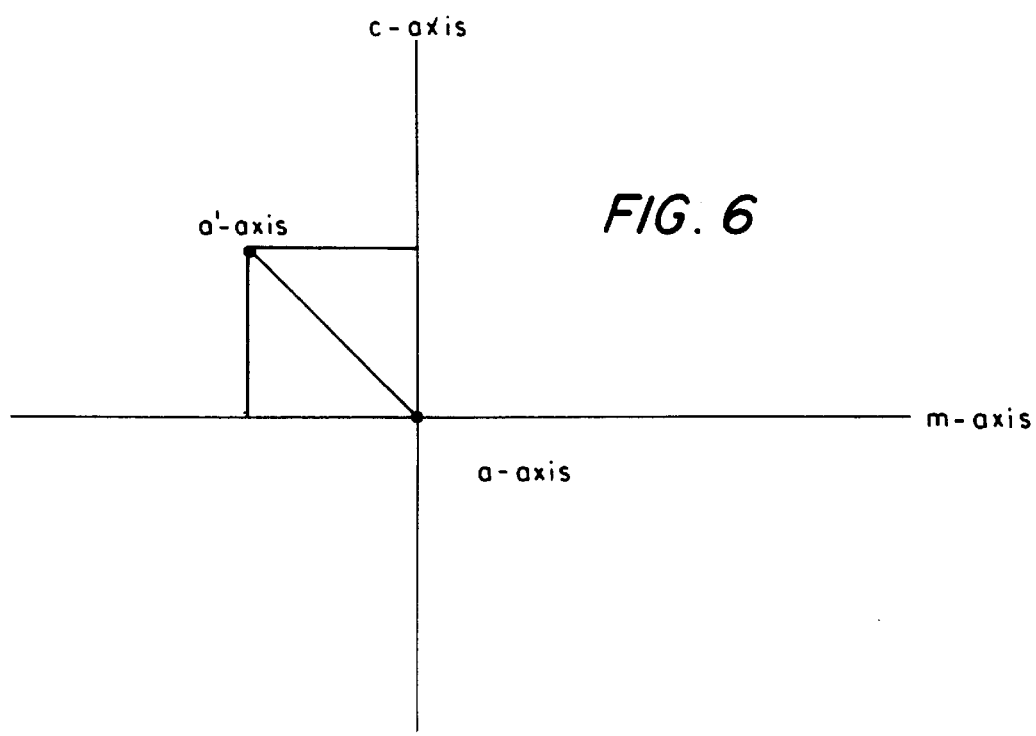
FIG. 6 is a schematic representation of a vicinal angle wherein the growth surface if the substrate is tilted towards other axes.

The vicinal angle is a measure of deviation from a-plane. Pursuant to the invention herein, the vicinal angle is typically 0.1–10°, preferably 0.2–5°, and more preferably 0.5–3°. FIG. 5 shows a sapphire crystal boule 500 with a-plane 502 and surface normal 503 extending from and being perpendicular to a-plane 502. Again, c-plane 504 is defined by the quadrangle 1-2-3-4 and m-plane 506 is defined by quadrangle 5-6-7-8. A cut is made through boule 500 at a vicinal angle from a-plane 502 and sliver or section 510 is removed to expose a a'-plane 508. Vicinal angle α is the angle between a-plane and a'-plane. A vicinal angle can be 0° from or towards another axis or axes, such as c-axis and/or m-axis. For instance, if the vicinal angle is 1.4°, a'-plane can be 1° off c-axis and 1° from m-axis. This condition is illustrated in FIG. 6 which shows a portion of an x-ray pattern where a'-axis is off c-axis by 1° and m-axis by 1° and the vicinal angle is 1.4°, which is determined by application of the Pythagorean theorem. The a-axis is also shown. The exact disposition of a'-plane can be determined by a person skilled in the art in a known way by the Laue back reflection x-ray technique and can be specified to the manufacturer of a sapphire crystal boule that has growth surface disposed off a-axis to the desired degree. Although a specific condition is schematically illustrated in FIG. 6, any other combination where a'-plane is tilted is contemplated herein and limited by the vicinal angle.

Sapphire that forms substrate 14 of FIG. 1 is alumina ($Al_2O_3$). Sapphire substrate is suitable herein principally due to its facile epitaxial growth of the film thereon. Naturally occurring sapphire is any of the gem varieties of the mineral corundum. especially the blue variety, except those that have medium to dark tones of red that characterize ruby. Impurities in sapphire determine color thereof. Impurities should be avoided since impurities do not typically promote electrical and crystal structure properties of sapphire substrates. Sapphire has hardness of 9 on the Mohr scale and specific gravity near 4.00. Artificially grown sapphire is preferred since it can be grown without any impurity.

Off-axis (off a-axis) sapphire substrates not only enhance electrical and crystal properties of the films grown thereon, they also provide a wider processing window and can be reduced in thickness down to about 30 microns since they do not crack as easily as the sapphire substrates that have c-plane growth surfaces. If a c-plane sapphire substrate is about 100 microns thick and an a'-plane or off a-plane sapphire substrate is about 30 microns thick, the thinner substrate represents not only a tremendous saving in material cost but also a tremendous increase in thermal conductivity. Thermal conductivity is of paramount importance in miniaturization since an electronic device can be made smaller if heat can be conducted away more expeditiously. Other advantages are also realized by making the substrate thinner.

Before a film is deposited on a substrate, the substrate should meet certain specifications noted hereafter. The growth surface of the substrate should not have visible scratches, pits, dimples or contamination when inspected under large-area, diffuse light and narrow beam, high intensity light. For substrate wafers of 2 to 3 inches in diameter, the edge exclusion is the outer 1 mm. Allowable warp of a substrate is the maximum distance between the highest and lowest points on the substrate thickness. On substrates of 2–3 inches in diameter, and 330–430 microns thick, maximum warp can vary from 11 to 12.5 microns on the thinner substrates and up to 25 microns on thicker substrates. Edge exclusion is the outer 1 mm. Maximum peak-to-valley deviation for surface flatness is measured on vacuum clamped substrate with frontside reference, excluding the outer 1 mm edge, and is a maximum of 25 microns for 2 and 3 diameter substrate wafers. Irregularities along the edge greater than 0.3×0.4 mm are considered to be an edge chip and are not allowed if they extend the length of the thickness of the coin edge of the substrate.

The film on the substrate is a semiconductor and is a compound containing one or more elements of Group III of the Periodic Table and one or more elements of Group V of the Periodic Table. A preferred film is a nitride of Group III elements of barium, aluminum, gallium, indium and titanium. Although gallium nitride is a specific and preferred example of such films, other examples include gallium phosphide, gallium arsenide, indium arsenide, indium phosphide, indium antimonide, aluminum antimonide, aluminum nitride, boron nitride, gallium aluminum arsenide, gallium indium arsenide, indium gallium phosphide, and the like.

The film of the electronic device disclosed herein is grown on the substrate conventionally by an epitaxial process. Any epitaxial deposition process can be used including organometallic chemical vapor deposition or OMCVD, vapor phase epitaxy or VPE, and the like. The films are deposited from compounds by OMCVD or from elements by VPE. The OMCVD deposition process is typically used and it will be described in conjunction with depositing a gallium nitride film.

Same or similar results can be obtained whether film deposition on sapphire substrate is carried out in a commercial OMCVD reactor or a modified version thereof. The commercial reactor is a resistively heated, quartz lined with stainless steel chamber equipped with a close spaced showerhead whereas the modified reactor can be an inductively heated, water-cooled quartz tube with a single inlet for gases.

Growth in any of the reactors is typically conducted at a total pressure of under about 100 Torr using hydrogen or another suitable carrier gas and other gaseous components, such as trimethyl gallium and ammonia, which react to form the film. Optimum electrical and crystalline properties are obtained when pressure is maintained under about 100 Torr. Pressures above and substantially below about 100 Torr are not conducive in producing films with optimum electrical and crystalline properties. A sapphire substrate disposed within the reactor is heated to a high temperature on the order of 1000° C. and a nucleation or a buffer layer of a couple of hundred angstroms is deposited on the substrate. The temperature of the substrate on the order of 1000° C. is used in order to desorb the substrate. Temperatures substantially below 1000° C. are not effective in the desorption process and temperatures substantially above 1000° C. can damage crystal structure of the substrate. If the barrier layer is too thin, it can be insufficient to promote good film growth by providing the lattice match to the film. A barrier layer that is too thick will not typically affect electrical and crystalline properties of the film but will be unnecessary. The buffer layer should be same or similar to the film. If the film is a nitride, the buffer layer should be a nitride, such as aluminum nitride or gallium nitride. After cooling and then reheating the substrate following deposition of the buffer layer, the film is deposited on the substrate by epitaxy by flowing gases into the chamber which react to form the film. The film on the substrate is then cooled, removed from the chamber and cut into small squares, or other shapes, of about 2 mm on the side, or any other desired dimension, which squares are then used to form electronic devices.

Table I, below sets forth summarized results of a statistical analysis of gallium nitride layers grown on a-plane or on-axis, and a'-plane, or off-axis, sapphire substrates using a vertical OMCVD modified reactor. The modified reactor was an inductively heated, water-cooled quartz tube about 75 mm ID wide and 900 mm long equipped with a single inlet for the gases. Growth was conducted at a total pressure of 50 Torr using hydrogen as the carrier gas. Nucleation layer 200 Å thick of aluminum nitride was initially grown on the substrate by flowing into the reactor triethyl aluminum and ammonia. After the nucleation layer was formed on the substrate, the component assembly was cooled and then reheated to 1015–1030° C. and the film was then grown on the substrate by flowing into the reactor trimethyl gallium at a rate of 26 µmol/min, ammonia at a rate of 1.05 slm (standard liters per minute), and hydrogen at a rate of 2.0 slm. The films were intentionally doped with silicon (Si) using silicon hydride ($Si_2H_6$) and were grown to a thickness of about 2.5 microns at a rate of about 1.75 microns/hr.

The crystalline quality of the films was evaluated from the gallium nitride (0002) x-ray rocking curves obtained on a high resolution double-crystal diffractometer using Cu K$\alpha_1$ radiation on a silicon (0001) beam conditioner in the (004) reflection mode. Substrate vicinal angles were measured by a combination of the Laue back-reflection and double crystal x-ray diffraction techniques with an accuracy limited to ±0.1°, which was judged to be adequate. The direction of the vicinal cut was determined from the Laue pattern, taking the substrate axes "m" [1$\bar{1}$00] and "c" [0001] as reference.

Results of the statistical analysis are summarized in Table I, below. Six test groups labeled (A) to (F) were examined, each consisting of 3 or more samples.

TABLE I

| Group No. | No. of samples/ process set | FWHM (arc s) | Mobility (300 K) (cm$^2$/V s) | n (300 K) (10$^{17}$ cm$^{-3}$) |
|---|---|---|---|---|
| (A) | 6 each/I | 425 ± 56, | 251 ± 46, | 3.89 ± 1.82 |
| (B) | 9 each/II | 385 ± 82, | 319 ± 54, | 1.78 ± 0.37 |
| (C) | 6 each/II | 335 ± 23, | 477 ± 19, | 2.45 ± 0.9 |
| (D) | 3 each/III | 304 ± 10, | 426 ± 20, | 3.82 ± 0.26 |
| (E) | 4 each/III | 284 ± 6, | 345 ± 32, | 1.75 ± 0.42 |
| (F) | 3 each/III | 258 ± 2, | 552 ± 24, | 1.73 ± 0.06 |

Table I, above, sets forth double-crystal full widths at half maximum (FWHM) and room temperature mobility for groups of samples grown on a plane sapphire substrates with different vicinal angles with same or similar processing parameters which did not affect the properties noted herein. The off-axis character of the substrates was as follows:

| | Vicinal angle |
|---|---|
| (A) and (B) | 0° |
| (C) and (D) | 1.2° (1.2° → m) |
| (E) | 0.5° |
| (F) | 1.4° (1° → m, 1° → c) |

Figure 7:
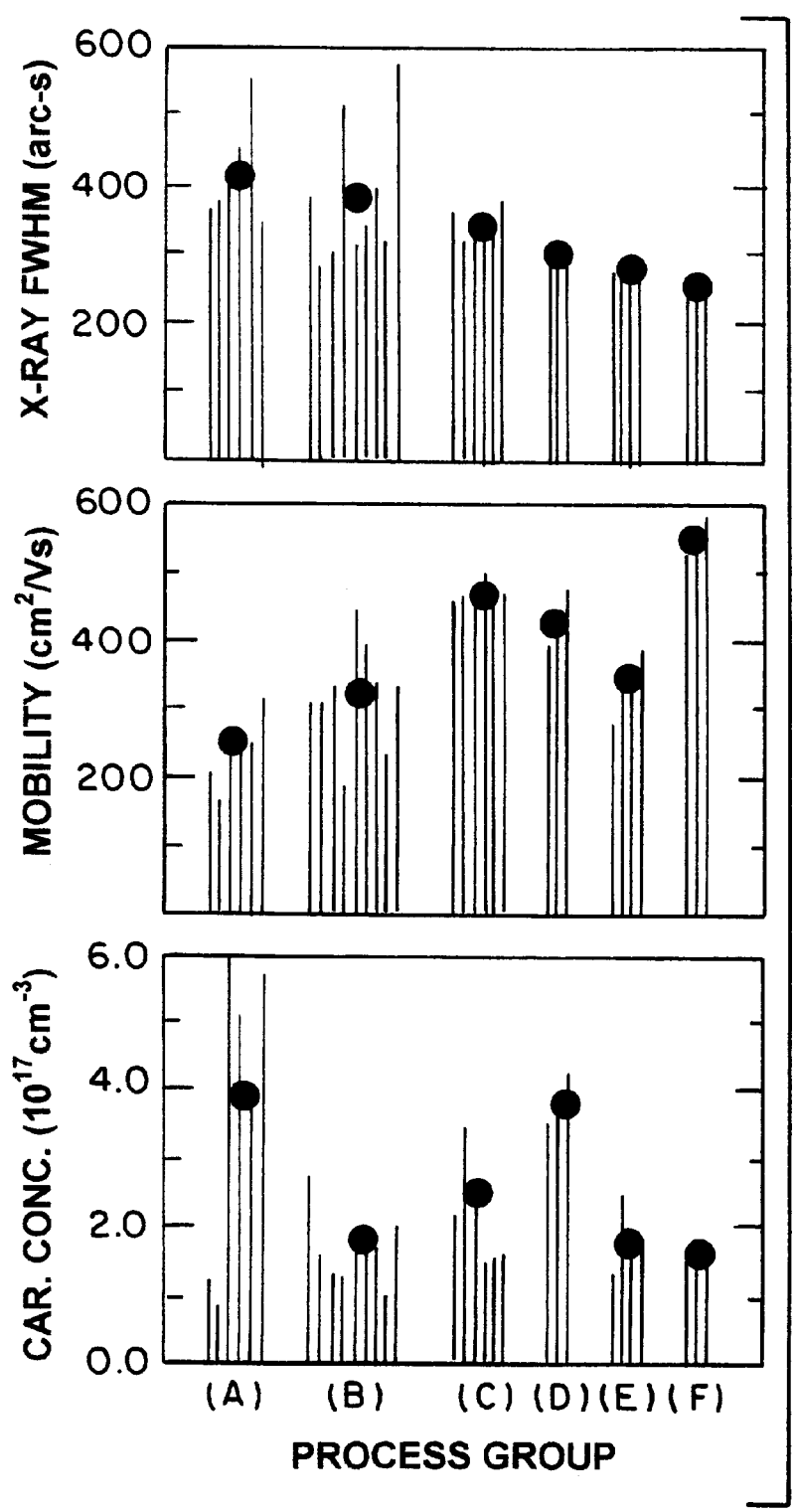
FIG. 7 is a graphical representation of the data given in Table 1.

A graphical representation of the data in Table I, above, is shown in FIG. 7, where the individual measurements appear as bar data in separate panels. The average values within each set are shown with a single point or a filled circle.

Additional data is set forth in Table II, below, on sample #1, #5, #9 and #11. Sample #1 had vicinal angle of 1.4°, sample #5 had vicinal angle of 0° or was on a-axis, sample #9 had vicinal angle of 1.2° and sample #11 had vicinal angle of about 1.4°.

TABLE II

| Sample No. | Test Region | Thickness ($\mu$m) | X-ray FWHM (arc s) | Mobility (300 K) (cm$^2$/V s) | n (300 K) 10$^{17}$/cm$^{-3}$ |
|---|---|---|---|---|---|
| #1 | Edge | 1.32 | 540 | 348 | 4.14 |
| 1.0° → m | R/2 | 1.63 | 924 | 377 | 5.72 |
| 1.0° → c | Center | 1.98 | 1030 | 362 | 5.09 |
| #5 | Edge | 1.89 | 958 | 230 | 4.07 |
| On-axis | R/2 | 1.98 | 1334 | 183 | 3.39 |
| | Center | 2.13 | 1425 | 158 | 3.84 |
| #9 | Edge | 1.44 | 530 | 353 | 4.04 |
| 1.2° → m | R/2 | 1.58 | 795 | 301 | 4.72 |
| | Center | 1.85 | 1000 | 363 | 5.26 |
| #11 | Edge | 1.73 | 580 | 323 | 4.14 |
| 1.2° → m | R/2 | 1.87 | 690 | 368 | 5.39 |
| 0.7° → c | Center | 2.04 | 930 | 360 | 4.83 |

$\mu$m = micron or micrometer

As confirmed by the data in Tables I and II above, the x-ray FWHM rocking curves are improved for vicinal angles of about 1.5° nearly twofold, and the mobility for off-axis substrates are surprisingly uniform not only within each wafer but also among different wafers in each test. In contrast, there is a significant variation in mobility when on-axis wafers are used.

Table II shows that the FWHM values for the on-axis sample #5 are significantly higher than for the off-axis samples. The lower FWHM values indicate improved crystalline quality. Also, the mobility values for the on-axis sample #5 are significantly lower than for the off-axis samples, indicating poorer electrical conduction. In addition, the mobility values for the on-axis sample #5 are considerably less uniform that the off-axis samples. The nonuniformity imposes a limitation on the usefulness of the material in the on-axis sample #5.

Figure 8A:
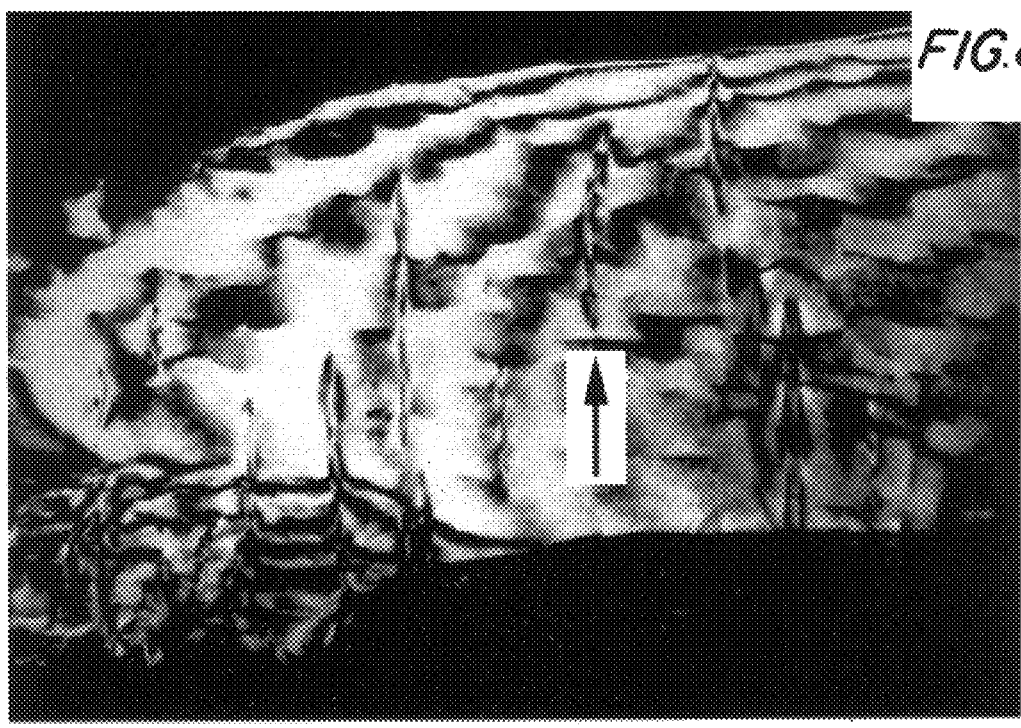
FIGS. 8(a) and (b) are dark-field, cross-sectional transmission electron micrographs of gallium nitride films grown on a-plane and off a-plane sapphire substrates.
Figure 8B:
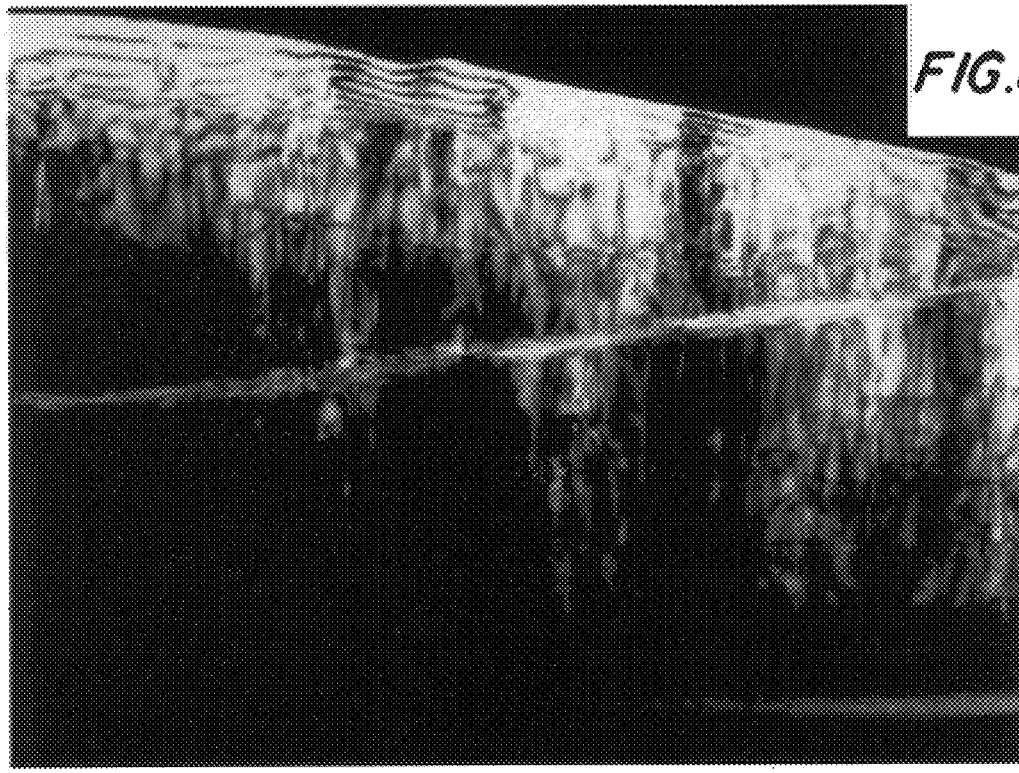

The films were also examined by cross-sectional transmission electron microscope (XTEM) for grain size, dislocation content and grain misorientation. FIG. 8(a) is a micrograph of sample #5 and FIG. 8(b) is a micrograph of sample #9 taken of the device in the disposition shown in FIG. 1, with the substrates disposed at the lower portion and the films disposed at the upper portion of the micrographs. Sample #5 is representative of on a-plane or on-axis growth and sample #9 is representative of off a-plane or off-axis growth where the substrate surface was at a vicinal angle to the a-plane. Both micrographs were imaged using gallium nitride <11$\bar{2}$0> reflection. The vertical lines in FIG. 8(a) are edge dislocations. The arrow points to one and there is a total of about 7 in FIG. 8(a). The strong contrast of the threading dislocations on the a-plane sample #5 suggests that they are of edge character. For the vicinal sample #9, however, fewer edge dislocations are seen. Overall, threading dislocation density for sample #5, and on-axis samples in general, is 10$^9$/cm$^2$ whereas density of the edge dislocations in sample #9, and off-axis or vicinal samples in general, is 10$^8$/cm$^2$. For both the vicinal and on-axis samples, the density of the screw and mixed dislocations is 10$^9$/cm$^2$. Thus, the total dislocation density for the vicinal sample #9 is about 1×10$^9$/cm$^2$ which is nearly half that of the on-axis sample #5. The fewer edge dislocations in the vicinal sample #9 may be due to improved grain alignment.

The reduced number of threading edge dislocations in the off-axis sample #9 helps to improve the flow of electrons through the film layer.

The grain size in both the on-axis sample #5 and the vicinal sample #9 was found by XTEM to be on the order of 1 micron.

The improved grain alignment and lower dislocation density may be responsible for the superior electrical properties in the vicinal sample #9 and in vicinal samples in general.

While presently preferred embodiments have been shown of the novel electronic devices, and of the several modifications discussed, persons skilled in this art will readily appreciate that various additional changes and modifications may be made without departing from the spirit of the invention as defined and differentiated by the following claims.

What we claim:

1. An electronic device comprising sapphire substrate having an off a-plane growth surface, a semiconducting nitride film of one or more elements of Group III and/or Group V of the Periodic Table disposed on said growth surface and an electrical energy source for operating said device.

2. The electronic device of claim 1 wherein said film is a Group III of the Periodic Table semiconductor.

3. The electronic device of claim 2 wherein said film is less than about 10 microns thick but greater than about 0.1 micron thick and said substrate is less than about 300 microns thick but greater than about 10 microns thick.

4. The electronic device of claim 1 wherein said growth surface has a vicinal angle of 0.1–10° and said film is a nitride of one or more elements of Group III elements of the Periodic Table.

5. The electronic device of claim 3 wherein the vicinal angle is about 0.2–5°.

6. The electronic device of claim 3 having improved rocking curves and room temperature (300 K) electron mobility, which mobility is about two times higher than typically obtained from an electronic device with the film growth on an on-axis a-plane sapphire substrate.

7. The electronic device of claim 5 wherein said film is a nitride of one or more elements selected from the group consisting of barium, aluminum, gallium, indium, titanium and mixtures thereof.

8. The electronic device of claim 5 wherein said film is selected from the group consisting of gallium nitride, indium nitride, aluminum nitride, boron nitride, and mixtures thereof.

9. The electronic device of claim 5 wherein said film is gallium nitride.

10. The electronic device of claim 5 wherein said substrate has a nucleating layer of about 10–1000 angstroms thickness disposed on said growth surface between said substrate and said film for the purpose of promoting growth of said film.

11. The electronic device of claim 10 wherein said nucleating layer is a film of one or more elements of Groups III–V elements of the Periodic Table.

12. The electronic device of claim 10 wherein said nucleating layer is a nitride film of one or more elements of Group III elements of the Periodic Table.

13. The electronic device of claim 12 wherein said nucleating layer is selected from the group consisting of aluminum nitride, gallium nitride and mixtures thereof.

14. An electronic device comprising a sapphire substrate having a polished growth surface, a nucleating layer disposed on the growth surface of said substrate to promote growth of a film thereon, a semiconducting film disposed on said nucleating layer and an electrical energy source for operatinf said device, wherein said growth surface is off a-plane.

15. The electronic device of claim 14 wherein said substrate is about 10–300 microns thick, said nucleating layer is 10–1000 angstroms thick, and said film is about 0.1–10 microns thick, said growth surface has vicinal angle of about 0.1–10°.

16. The electronic device of claim 15 wherein said film is selected from the group consisting of gallium nitride, gallium phosphide, gallium arsenide, indium arsenide, indium phosphide, indium antimonide, aluminum antimonide, aluminum nitride, boron nitride, gallium aluminum arsenide, gallium indium arsenide, indium gallium phosphide, and mixtures thereof.

17. The electronic device of claim 16 wherein said nucleating layer is a film of one or more elements of Group III–V elements of the Periodic Table.

18. The electronic device of claim 16 wherein said nucleating layer is selected from the group consisting of aluminum nitride, gallium nitride, and mixtures thereof, and wherein said film is gallium nitride.

* * * * *